United States Patent
Lu et al.

(10) Patent No.: US 12,051,610 B2
(45) Date of Patent: Jul. 30, 2024

(54) MICRO ASSEMBLER WITH FINE ANGLE CONTROL

(71) Applicant: PALO ALTO RESEARCH CENTER INCORPORATED, Palo Alto, CA (US)

(72) Inventors: JengPing Lu, Fremont, CA (US); Eugene M. Chow, Palo Alto, CA (US); David K. Biegelsen, Portola Valley, CA (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 18/126,520

(22) Filed: Mar. 27, 2023

(65) Prior Publication Data

US 2023/0369089 A1 Nov. 16, 2023

Related U.S. Application Data

(63) Continuation of application No. 17/690,485, filed on Mar. 9, 2022, now Pat. No. 11,615,976, which is a (Continued)

(51) Int. Cl.
*H01L 21/68* (2006.01)
*H01L 21/683* (2006.01)

(52) U.S. Cl.
CPC .......... *H01L 21/68* (2013.01); *H01L 21/6831* (2013.01); *H01L 21/6833* (2013.01)

(58) Field of Classification Search
CPC ............... H01L 21/67121; H01L 21/68; H01L 21/6835; H01L 21/6875; H01L 21/683; H01L 21/6831; H01L 21/06; H01L 21/027; H01L 25/50; H01L 25/0655; H01L 2224/95; H01L 2224/95085; H01L 2224/95133; H01L 2224/83894; H01L 2224/95122; H01L 2224/95136; H01L 2224/95144; H01L 2224/95145
See application file for complete search history.

(56) References Cited

U.S. PATENT DOCUMENTS 6,790,425 B1   9/2004  Smalley et al.
7,332,361 B2 * 2/2008  Lu ........................... H01L 25/50
                                                    257/E21.705

(Continued)

FOREIGN PATENT DOCUMENTS

EP          2851336          3/2015

OTHER PUBLICATIONS

European Search Report from EP Application No. 19216338,4 dated May 13, 2020, 7 pages.

(Continued)

*Primary Examiner* — Bryan R Perez
(74) *Attorney, Agent, or Firm* — Mueting Raasch Group

(57) ABSTRACT

First and second chiplets are positioned along a surface to respectively cover first and second electrodes. The first electrode is activated to cause an attraction force between the first electrode and the first chiplet. The second electrode is deactivated allowing the second chiplet to rotate on the surface. While the first electrode is activated and the second electrode is deactivated, a rotation field is applied to cause the second chiplet to be oriented at a desired orientation angle, the first chiplet being prevented from rotating by the attraction force.

20 Claims, 6 Drawing Sheets

Related U.S. Application Data continuation of application No. 16/221,803, filed on Dec. 17, 2018, now Pat. No. 11,302,554.

(56) References Cited

U.S. PATENT DOCUMENTS

| | | |
|---|---|---|
| 10,043,687 B2 | 8/2018 | Bert et al. |
| 2017/0243805 A1* | 8/2017 | Lendenmann ........ H01L 25/072 |
| 2018/0182650 A1 | 6/2018 | Bert et al. |

OTHER PUBLICATIONS

Masubuchi et al., "Autonomous robotic searching and assembly of two-dimensional crystals to build van der Waals supertattices", Nature Communications 9:1413, 2018, pp. 1-12.

Novoselov et al., "2D materials and van der Waals heterostructures", Science, vol. 353, Issue 6298, Jul. 29, 2016, 13 pages.

* cited by examiner

MICRO ASSEMBLER WITH FINE ANGLE CONTROL

RELATED PATENT DOCUMENTS

This application is a continuation of U.S. application Ser. No. 17/690,485, filed Mar. 9, 2022, which is a continuation of U.S. application Ser. No. 16/221,803 filed Dec. 17, 2018, now U.S. Pat. No. 11,302,554, the disclosures of which are incorporated herein by reference in their entireties.

SUMMARY

The present disclosure is directed to a micro assembler with fine angle control. In one embodiment, first and second electrodes are arranged along a surface such that first and second chiplets are positioned to respectively cover the first and second electrodes. An interface circuit is operable to individually activate and deactivate the first and second electrodes. A field generator is operable to apply a rotation field that causes a rotation of the first and second chiplets on the surface. A processor is coupled to the interface circuit and the field generator and is operable to: activate the first electrode to cause an attraction force between the first electrode and the first chiplet; deactivate the second electrode allowing the second chiplet to rotate on the surface; and while the first electrode is activated and the second electrode is deactivated, apply the rotation field to cause the second chiplet to be oriented at a desired orientation angle, the first chiplet being prevented from rotating by the attraction force.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

DETAILED DESCRIPTION

The present disclosure relates to automated assembly of micro objects with fine orientation control. One particular example is assembly of thin materials. Certain classes of materials, such as van der Waals materials or two-dimensional (2-D) materials may formed as a sheet that can be as thin as one molecule in thickness. One well-known example of a 2-D material is graphene, which is a single-molecule lattice of carbon atoms. Many 2-D materials have uncommon properties (e.g., mechanical strength, low thermal and electrical resistance, etc.) and so there is interest in the development of devices that use 2-D materials.

In order to mass-produce devices using 2-D materials, automated systems are needed to, among other things, manufacture bulk 2-D material (e.g., via exfoliation or chemical layer deposition), divide the bulk material into individual units of the desired size, and move the units into a desired location and orientation, and then manipulate the units to form and assembly (e.g., stack 2-D materials together and/or assemble with other components). Methods and apparatuses have been devised to separate the materials into individual units (referred to herein as 'chiplets') and move the chiplets into a desired location, e.g., a grid that allows the chiplets to be picked up individually or collectively. Note that the present embodiments are not limited to the assembly of 2-D materials, and may be applicable to any mass assembly process that involves automatically orienting large numbers of small objects such as chiplets.

Figure 1:
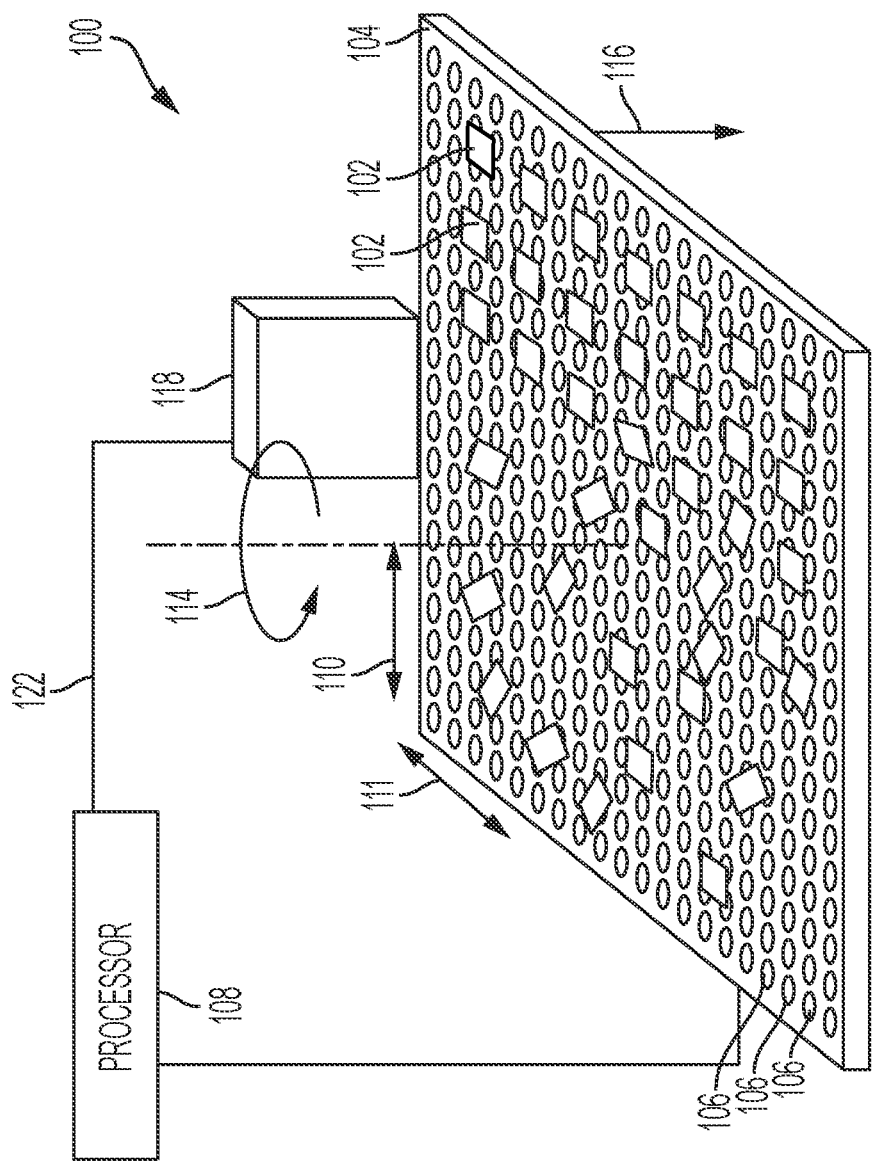
FIG. 1 is a diagram of a micro assembler apparatus according to an example embodiment.

The present disclosure relates to methods and apparatuses used to move and rotate chiplets into a desired orientation. In FIG. 1, an isometric view shows an apparatus 100 according to an example embodiment. The apparatus 100, also referred to herein as a micro assembler used to manipulate chiplets 102. The chiplets are moved onto an assembly surface 104 that includes an array of electrodes 106. A layer of dielectric fluid may also be spread across the assembly surface to reduce friction.

A processor 108 selectively sends voltages to the electrodes 106 to arrange the chiplets 102 to the specific locations on the assembly surface 104. Electrostatic force generated by the electrode array to move chiplets to the specific locations on the assembly surface 104 along first and second directions 110, 111 (e.g., arbitrarily defined x and y directions). Since the chiplets 102 usually provide significant conductivity difference to a dielectric fluid medium that is on the surface 104, induced dipoles align the long side of the chiplet to the net electric field direction. However, since the electrode array pixelates electric fields in the 2D spatial plane (generally along the assembly surface 104), it has been found that it will be difficult to achieve continuous fine angle orientation using this structure.

The illustrated apparatus can achieve very fine arbitrary angle control for individual chiplets 102 via a rotational field 114 that is orthogonal to electrostatic forces that are used for assembling chiplets 102 to the desired X-Y positions on the assembly surface. Block 118 represents a field generator that applies the rotation field 114 that is orthogonal to a clamping force field 116 applied by the electrodes 106. The field generator includes an input 122 (e.g., a signal line) that selects an angle of the rotation field 114. The processor 108 is coupled to the field generator 118 and operable to determine a desired orientation angle of a first subset of the chiplets 102. The processor 108 is coupled to the field generator 118 and electrodes 106 (and other devices described herein, such as sensors) via interface circuitry that may include any combination of input/output busses, preamplifiers, power amplifiers, digital to analog converters, analog to digital converters, filters, digital signal processors, etc.

One or more of the electrodes are activated so that a second subset of the chiplets different than the first subset is kept from rotating by the clamping force field 116 applied by the one or more of the electrodes 106. While the clamping force field 116 is being selectively applied to the second subset of chiplets, the rotation field is applied at the selected angle to cause the first subset of the chiplets to be oriented at the desired orientation angle.

Note that the spacings of the electrodes 106 are defined relative to the dimensions of the chiplets 102 so that a chiplet 102 overlaps at least one electrode 106. The processor 108 (e.g., using optical image capture to detect xy-location and angle of each chiplet 102 relative to surface 104) can determine which chiplets 102 overlay which electrodes 106. This can be used to form a mapping of chiplets 102 to electrodes 106. This mapping can be used to selectively energize electrostatic clamping 116 forces on subsets of the chiplets 102, while others not in the subsets can be rotated via the field generator 118.

In order for the chiplets 102 to be affected by the rotational field 114, they may be formed so as to predictably respond to the field 114. For example, if the rotational field 114 is a magnetic field, then the chiplets 102 may be mated to magnetic materials such as ferromagnetic strips. The chiplets 102 themselves may instead or in addition have an anisotropic magnetic response. Other rotation fields, such as an acoustic field, may not require any special adaptation or inherent properties of the chiplets 102.

Figure 2:
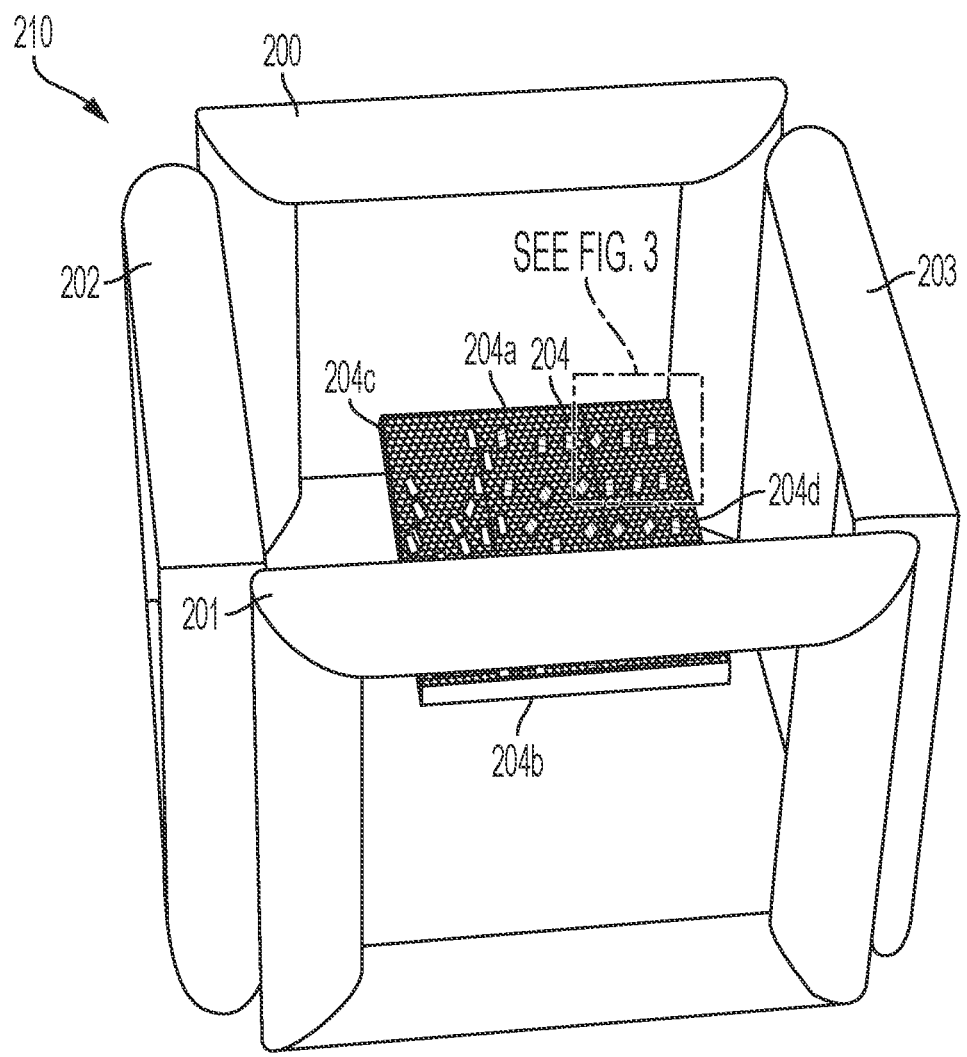
FIG. 2 is an isometric view of a micro assembler according to another example embodiment.

In FIG. 2, an isometric view shows a micro assembler 210 that utilizes magnetic force according to an example embodiment. Magnetic forces can be readily generated and controlled by electrical coils. In this example a first pair 200, 201 and a second pair 202, 203 of Helmholtz coils are oriented 90 degrees to each other. The first pair 200, 201 of coils are located on a first pair of opposite sides 204*a*, 204*b* of an assembly surface 204 and the second pair of coils 202, 203 located on a second pair of opposite sides 204*c*, 204*d* of the assembly surface.

The coils 200-203 generate uniform B field with arbitrary angles based on the current ratio of the first and second currents sent to the respective first pair 200, 201 and second pair 202, 203. The arbitrary angle, uniform B field will be applied to all the chiplets 300 on the assembly surface 204, as shown in the detail view in FIG. 3. These chiplets may have strips of patterned ferromagnetic material, such as Ni, embedded such that chiplets 300 will align to the B-field direction when they are not clamped down by the attraction force generated by assembler electrode array. For example, all the chiplets 300 can be rotated in parallel until the desired angles have been reached. When the desired angles are reached for a subset of the chiplets, the assembler electrodes 302 underneath the subset are activated to produce a strong dielectrophoretic (DEP) attraction force. The attraction force clamps the subset of chiplets 300 to the surface 204 and prevents them from rotating any further. The B field can keep rotating until all the desired angles of the chiplets 300 have been reached. Note that it is possible to partially clamp chiplets to be rotated so that a rotation point (e.g., a centroid) of a chiplet is fixed while the chiplet is rotated.

The actuation electrodes 302 to generate the clamping DEP force will be chosen such that they are fully inside the chiplet-covering area so as to prevent any induced electric field interfering the chiplet edge and chiplet angle. Since the current ratio of the Helmholtz pairs 200-203 can be controlled precisely with precision digital-to-analog converters (DAC) and quality electronics, it is possible for this arrangement to provide angle control of chiplets on the order of 0.1 degrees.

Figure 3:
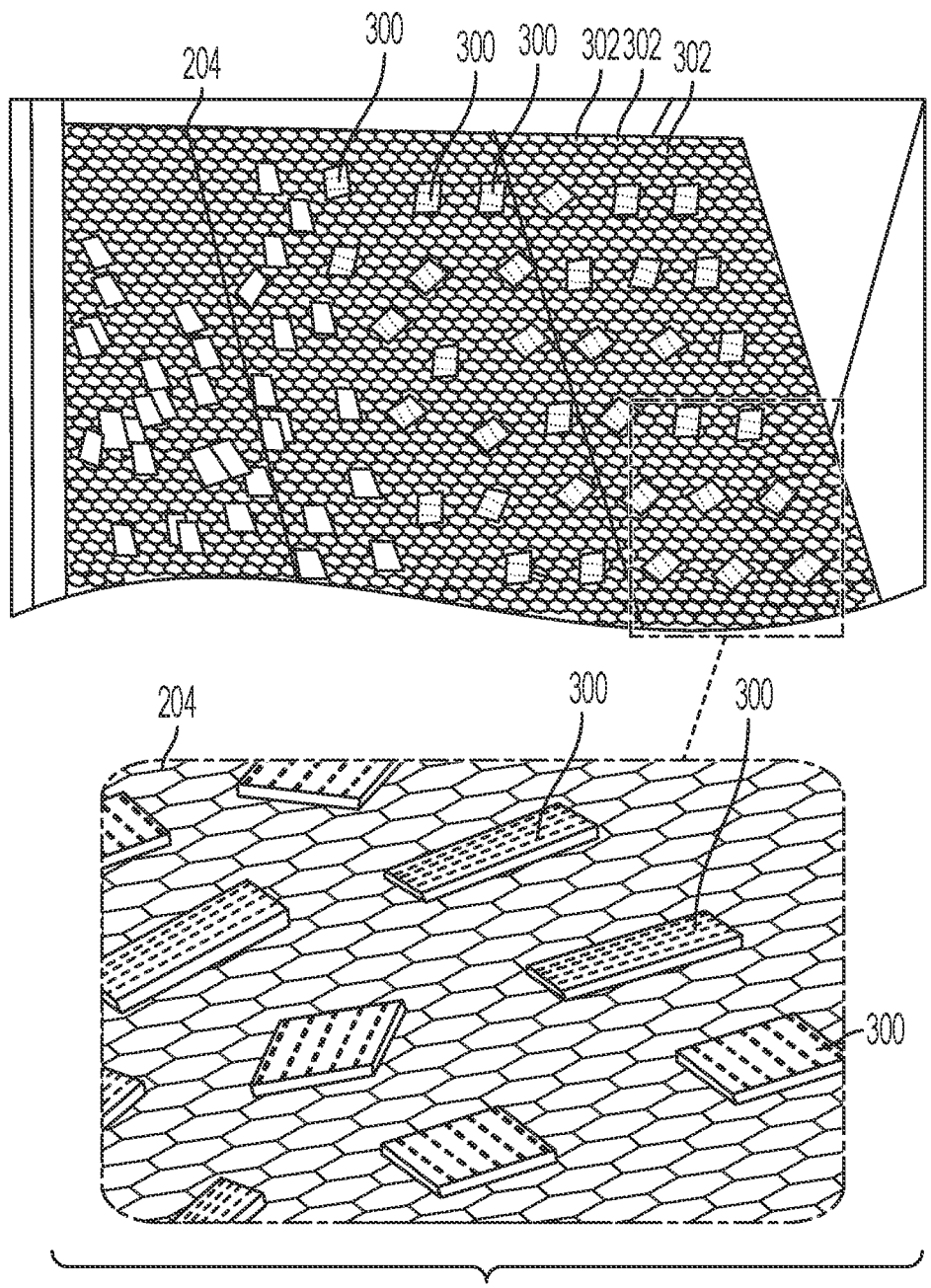
FIG. 3 is a close up view of the micro assembler shown in FIG. 2.
Figure 4:
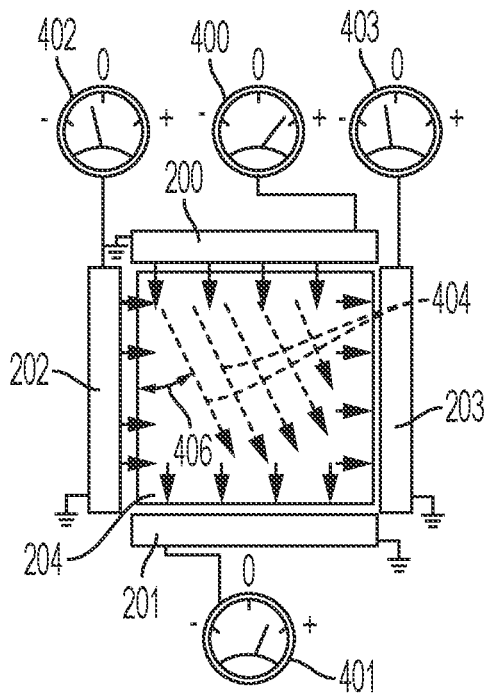
FIGS. 4 and 5 are diagrams showing the adjustment of field angle by changing coil currents according to an example embodiment.
Figure 5:
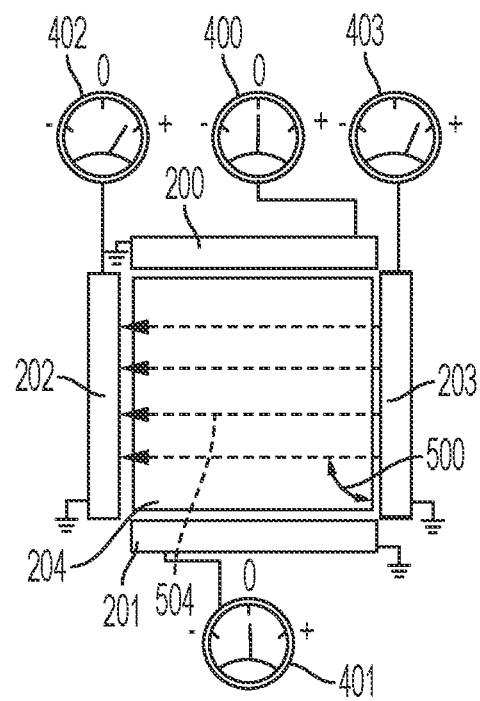

In FIGS. 4 and 5, diagrams illustrate an example of how magnetic fields can be changed in the micro assembler 210 shown in FIGS. 2 and 3. Power sources 400-403 are shown as meters that schematically represent magnitude and direction of electrical current applied to respective coils 200-203.

Note that four individual sources 400-403 are not strictly needed, e.g., a single current source can be used for each pair 200-201, 202-203, e.g., by wiring the coils within the pairs in series or in parallel with a power source.

As seen in FIG. 4, current applied to all four coils in different directions results in a first angle 406 between the resultant magnetic field 404 and the assembly surface 204. As seen in FIG. 5, a different combination of currents, in this case with current from sources 400 and 401 being zero, results in a different angle 500, one that is aligned with the field 504 generated by coil pair 202 and 203.

Figure 6:
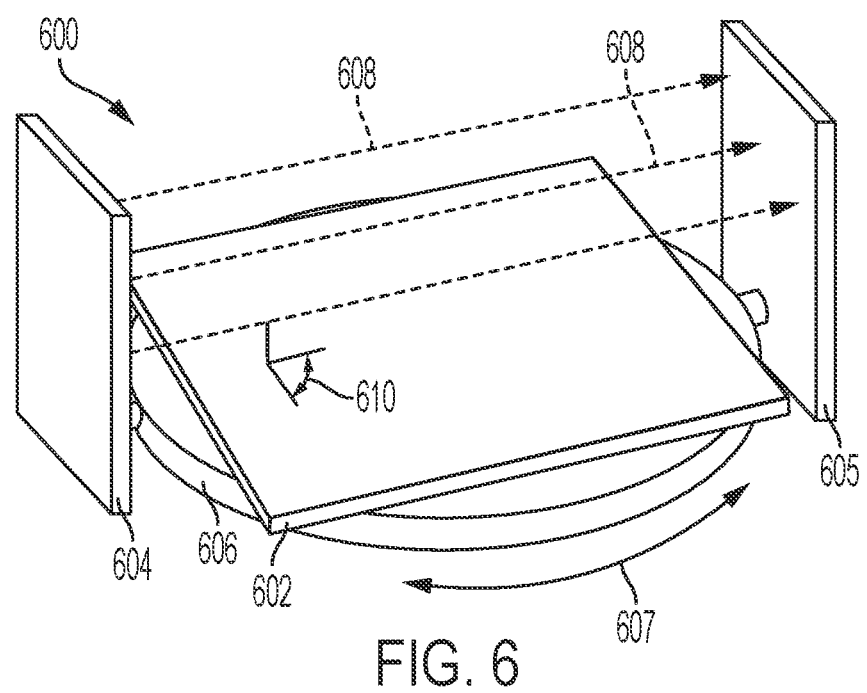
FIG. 6 is an isometric view of a micro assembler according to another example embodiment.

In FIG. 6, an isometric view shows a micro assembler 600 that utilizes magnetic force according to another example embodiment. An assembly surface 602 is between a pair 604, 605 of magnets, e.g., Helmoltz coils, permanent magnets. A structure 606 holds the magnets 604, 605 in position relative to the surface 602, and, as indicated by arrow 607, one or both of the structure 606 and surface 602 can rotate, e.g., via a motor. This relative rotation between the magnets 604, 605 and the surface allows selectively changing an angle 610 between the surface 602 and a magnetic field 608 generated by the magnets 604, 605.

Figure 7:
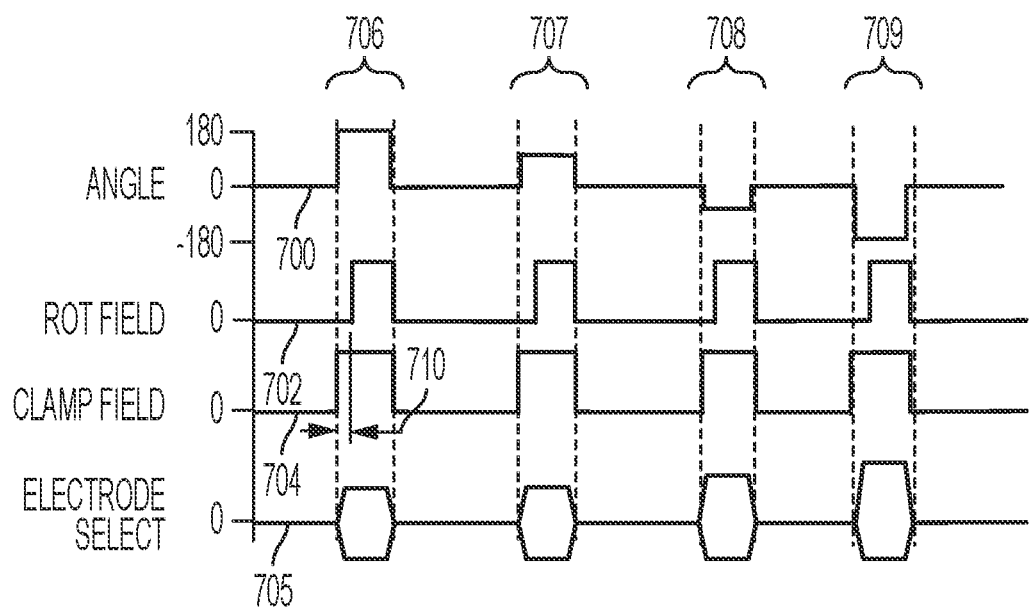
FIGS. 7, 8, and 9 are signal diagram showing operation of a micro assembler according to example embodiments

In FIG. 7, a signal diagram illustrates inputs to a micro assembler according to an example embodiment. Trace 700 represents a desired angle between the assembly surface and the rotation field, and in this example is an analog or digital value that ranges from −180 to 180, representing a 360 degree range of rotation. Trace 702 represents a magnitude of the rotation field, ranging from zero to some maximum value. Note that for a micro assembler as shown in FIG. 2, these signals 700, 702 could be translated, e.g., via a logic circuit, to first and second currents applied to first and second coil pairs. In such a configuration, the first and second currents could range from −A to +A, where A is a maximum current magnitude.

Trace 704 represents a voltage applied to selected set of electrodes to apply a clamping field. This trace 704 is simultaneously accompanied by a selection signal 705 that selects a subset of the electrodes, such that the current represented by trace 704 is only applied to those electrodes. For purposes of this disclosure, a subset of the chiplets is intended to indicate at least one chiplet selected from all of the chiplets on the assembly surface, and fewer than all of the chiplets. For this example, the signal 705 represents a group of clamping electrodes being activated. In another implementation, the signal 705 could be represented by an n-bit number, each bit corresponding to one of the n-electrodes. If a bit in the number is one, the electrode is selected and current from trace 704 is applied. Otherwise, if the bit is zero the electrode is deselected an no current is applied.

During time periods 706-709, the clamping force is applied to the electrodes and the field activated at a particular rotation angle. In this simple example, the angle changes from around 180 degrees in time period 706 to −180 degrees in time period 709. Note that during each period 706-709, there is a delay (e.g., 710) between activating the clamping force via signal 704 and applying the rotation field via 702, which allows some time for the clamping forces to stabilize before applying the rotation force. Note that this example is for purposes of illustration and not limitation, and the selective rotation can be achieved using alternate signals and sequences. For example, the change in the angle signal 700 between time periods 706-709 need not be a steady increase or decrease, but may change in any order.

Figure 8:
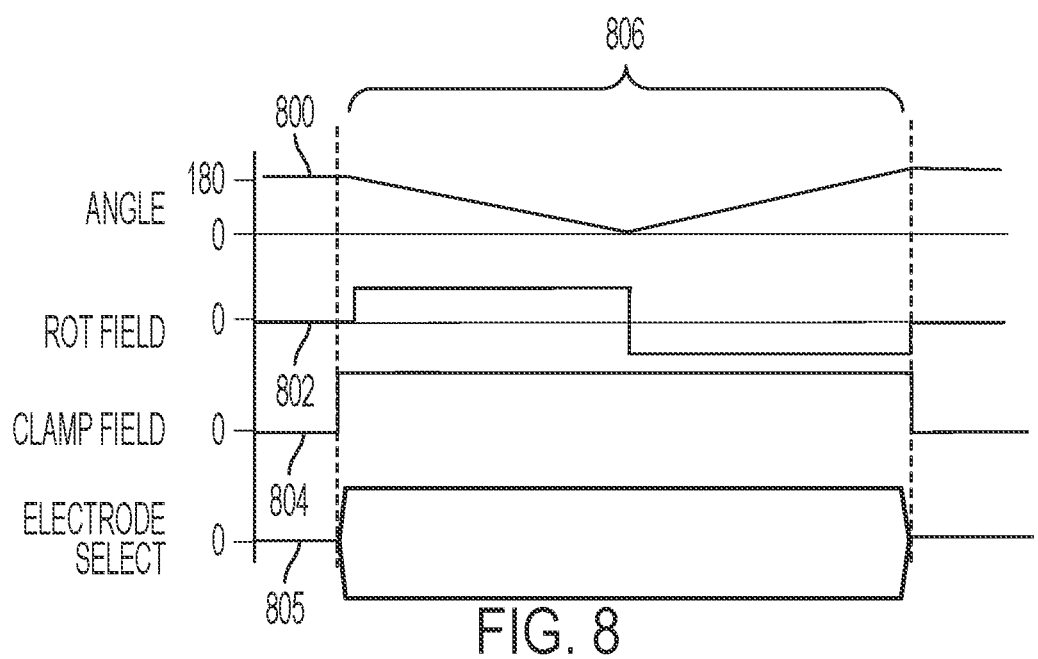

In FIG. 8, a signal diagram shows microassembler operations according to another example embodiment. In this case, the signals 800, 802, 804, 805 change continuously or discretely within a single time period 806. Rotation signal 800 differs in this example in that it represents an unsigned number from 0 to 180 degrees, and the field signal 802 can change from positive to negative to enable the remaining rotation between 0 and −180 degrees. The clamping force current 804 remains on during the entire period 806, while the selection signal 805 successively activates more electrodes and after chiplets associated with the electrodes are aligned at desired angles.

Figure 9:
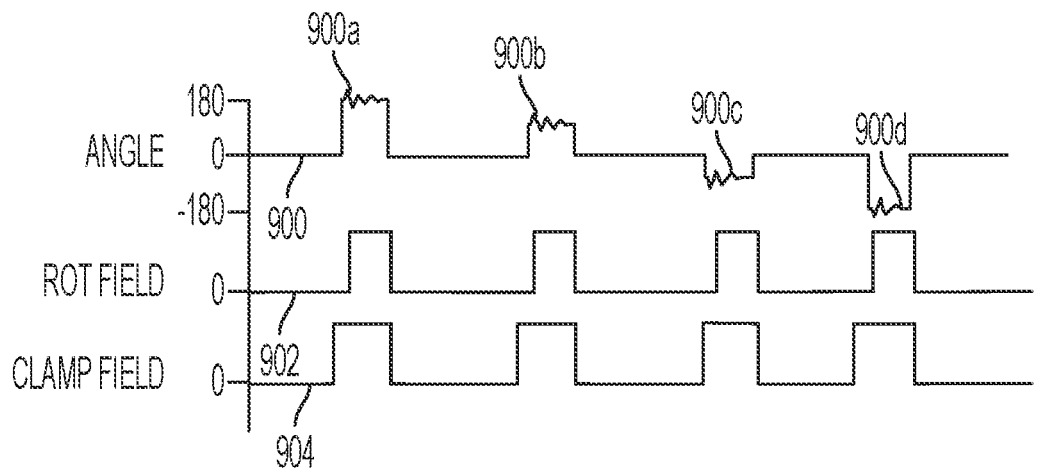

In order to assist in smooth movement of the chiplets over the assembly surface, the assembly surface may be covered by a thin layer of dielectric fluid. Even with such a fluid, there may be small forces that tend to inhibit movement of the chiplets. These forces are referred to herein as 'stiction,' and may be caused by any combination of phenomena such as friction, stray electrostatic forces, fluid viscosity, surface tension, etc. In FIG. 9, a signal diagram shows how a rotation field according to an example embodiment can be configured to help overcome stiction between the chiplets and the assembly surface. This example uses an angle signal 900, rotation field signal 902 and clamping field signal 904 similar to the example in FIG. 7.

During times when the rotation field signal 902 is activating the rotation field, modulations 900*a-d* are applied to the angle signal 900, e.g., via processor and associated signal conditioning circuitry. These modulations result in time-varying the direction of the magnetic field around the target angle of the rotation field to induce small movements in the first subset of the chiplets and assist in the chiplets reaching the target angle. The small movements overcome stiction between the first subset of the chiplets and the assembly surface. Note that other signals could be modulated similar to the angle signal 900. For example, the field signal 904 could be similarly modulated when it is activated. In other embodiments, the clamping field signal 904 could be quickly and selectively applied to and released from targeted chiplets to induce movements that assist in the chiplets reaching the target angle.

The modulations 900*a-d* applied to this or other signals could be any type of waveform such as sinusoidal, sawtooth, square wave, random, impulse, exponentially decaying, etc. The modulations 900*a-d* may have one or more base frequencies that are selected to excite movement for a particular type of field, chiplet, assembly surface, surface fluid, etc. These frequencies may be known beforehand, or be determined during operation, e.g., by sweeping through a range of frequencies and observing (e.g., via optical recognition) magnitude of rotation for each frequency in the range.

Figure 10:
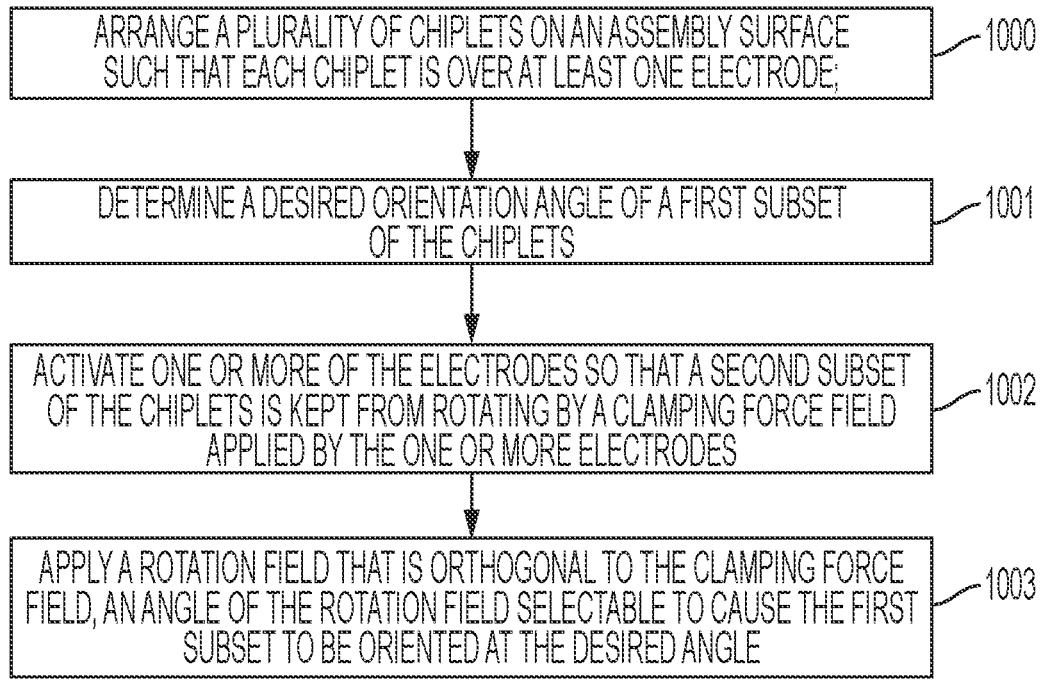
FIG. 10 is a flowchart of a method according to an example embodiment.

In FIG. 10, a flowchart shows a method according to an example embodiment. The method involves arranging 1000 a plurality of chiplets on an assembly surface, e.g., such that the chiplets do not interfere with one another. The assembly surface has an array of electrodes and the chiplets are arranged such that each chiplet is over at least one of the electrodes. A desired orientation angle of a first subset of the chiplets is determined 1001. One or more of the electrodes is activated 1002 so that a second subset of the chiplets (different than the first subset) is kept from rotating by a clamping force field applied by the one or more electrodes. A rotation field is applied 1003 that is orthogonal to the clamping force field applied by the one or more electrodes. An angle of the rotation field is selectable to cause the first subset of the chiplets to be oriented at the desired orientation angle. These processes of determining an orientation 1001, activating 1002 the electrodes, and applying 1003 the rotation field can be repeated for increasingly smaller subsets of the chiplets, while adding to the number of chiplets that are being clamped by the electrodes.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. An apparatus, comprising:
an assembly surface operable to receive objects, the assembly surface comprising an array of electrodes, each of the electrodes capable of being individually activated to apply a clamping force field to one of the objects;
a field generator operable to apply a rotation field to the objects on the assembly surface, the rotation field orthogonal to the clamping force field; and
a processor coupled to the field generator, the processor selectively activating the rotation field to selectively rotate the objects to different desired orientation angles.

2. The apparatus of claim 1, wherein the objects have inherent properties that cause the objects to align to the rotation field.

3. The apparatus of claim 2, wherein the rotation field comprises a magnetic field, and wherein the inherent properties comprise an anisotropic magnetic response.

4. The apparatus of claim 1, wherein the rotation field comprises a magnetic field, and wherein the objects are mated to magnetic materials.

5. The apparatus of claim 1, wherein the assembly surface is covered by a dielectric fluid that assists in smooth movements of the objects on the assembly surface.

6. The apparatus of claim 1, wherein the processor outputs a modulated signal to cause the field generator to produce a time-varying field that induces small angular movements in the objects.

7. The apparatus of claim 1, wherein the assembly surface comprises a first electrode that is selectively activated to apply a clamping force preventing a first one of the objects from rotating when the rotation field is activated.

8. The apparatus of claim 7, wherein the assembly surface comprises a second electrode that is activated to partially clamp a second one of the objects so that a rotation point of the second object is fixed while the second object is rotated.

9. The apparatus of claim 1, wherein the assembly surface comprises a plurality of electrodes that are activated to partially clamp the objects so that a rotation point of the objects are fixed while the objects are rotated.

10. The apparatus of claim 9, wherein the electrodes are further activated to move the objects to specific locations on the assembly surface.

11. A method, comprising:
moving a plurality of objects onto an assembly surface, the assembly surface comprising an array of electrodes, each of the electrodes capable of being individually activated to apply a clamping force field to one of the objects;
apply a rotation field to the objects on the surface via a field generator the rotation field orthogonal to the clamping force field; and
selectively activating the rotation field to selectively rotate the objects to different desired orientation angles.

12. The method of claim 11, wherein the objects have inherent properties that cause the objects to align to the rotation field.

13. The method of claim 12, wherein the rotation field comprises a magnetic field, and wherein the inherent properties comprise an anisotropic magnetic response.

14. The method of claim 11, wherein the rotation field comprises a magnetic field, and wherein the objects are mated to magnetic materials.

15. The method of claim 11, wherein the assembly surface is covered by a dielectric fluid that assists in smooth movements of the objects on the assembly surface.

16. The method of claim 11, wherein selectively activating the rotation field comprises t modulating a signal to cause the field generator to produce a time-varying field that induces small angular movements in the objects.

17. The method of claim 11, further comprising selectively activating a first electrode to apply a clamping force that prevents a first one of the objects from rotating when the rotation field is activated.

18. The method of claim 17, further comprising activating a second electrode to partially clamp a second one of the objects so that a rotation point of the second object is fixed while the second object is rotated.

19. The method of claim 11, further comprising activating a plurality of electrodes to partially clamp the objects so that a rotation point of the objects are fixed while the objects are rotated.

20. The method of claim 19, further comprising moving the objects to specific locations on the assembly surface via the electrodes.

* * * * *